(12) United States Patent
Rehm et al.

(10) Patent No.: US 8,155,831 B2
(45) Date of Patent: Apr. 10, 2012

(54) FLAT PANEL TOUCH INTERFACE FOR VEHICLE CLIMATE CONTROL SYSTEM

(75) Inventors: Oliver Rehm, Clarkston, MI (US); Ermina Hajdarevic, Troy, MI (US)

(73) Assignee: Continental Automotive Systems US, Inc., Auburn Hills ( * ) Notice: Subject to any disclaimer, the term of this patent is extended or adjusted under 35 U.S.C. 154(b) by 563 days.

(21) Appl. No.: 12/359,477

(22) Filed: Jan. 26, 2009

(65) Prior Publication Data

US 2009/0192672 A1    Jul. 30, 2009

Related U.S. Application Data

(60) Provisional application No. 61/062,254, filed on Jan. 24, 2008.

(51) Int. Cl.
*G06F 19/00* (2006.01)
(52) U.S. Cl. .......................................... 701/36; 345/174
(58) Field of Classification Search ................. 701/36; 205/5 R; 345/173, 174; 386/1; 349/74
See application file for complete search history.

(56) References Cited

U.S. PATENT DOCUMENTS

| 6,301,118 | B1 * | 10/2001 | Lacroix et al. ................ 361/736 |
| 7,295,190 | B2 * | 11/2007 | Philipp .......................... 345/173 |
| 7,969,330 | B2 * | 6/2011 | Philipp .......................... 341/33 |
| 2005/0133347 | A1 | 6/2005 | Hein |
| 2005/0181827 | A1 * | 8/2005 | Nieminen-Sundell et al. .............................. 455/557 |
| 2007/0103451 | A1 * | 5/2007 | Heimann et al. .............. 345/173 |
| 2007/0152977 | A1 * | 7/2007 | Ng et al. ....................... 345/173 |
| 2009/0033635 | A1 * | 2/2009 | Wai ................................ 345/174 |

FOREIGN PATENT DOCUMENTS

| DE | 10359123 | 7/2005 |
| FR | 2755912 | 5/1998 |
| FR | 2773117 | 7/1999 |
| GB | 2418023 | 3/2006 |

OTHER PUBLICATIONS

International Search Report and Written Opinion mailed on Apr. 14, 2009.
International Preliminary Report on Patentability for PCT/US2009/031951 mailed on Aug. 5, 2010.

* cited by examiner

*Primary Examiner* — Thomas Black
*Assistant Examiner* — Marthe Marc-Coleman

(57) ABSTRACT

A vehicle control panel includes knobs and a touch sensitive interface in the place of conventional mechanically activated buttons. The substitution is implemented without modification to the bezel or console assembly and with many components common to consoles utilizing conventional mechanically activated buttons.

15 Claims, 5 Drawing Sheets

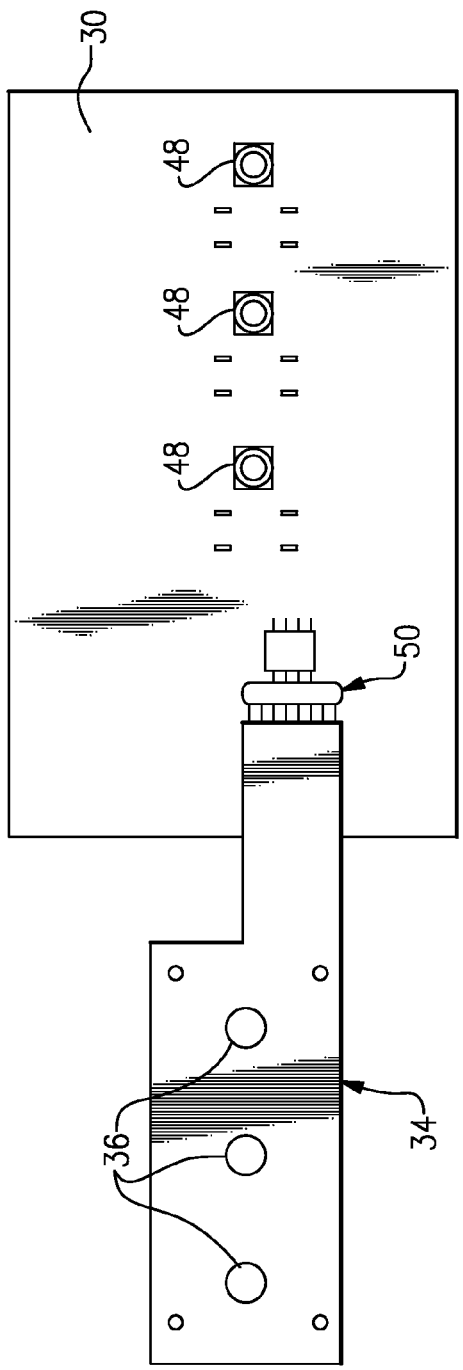
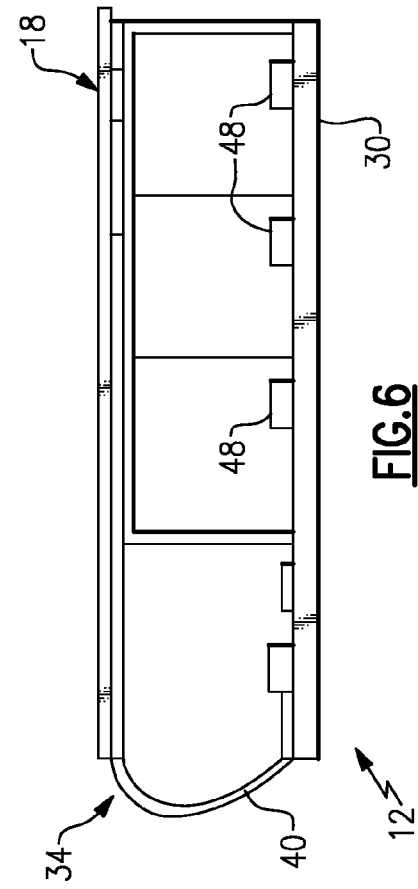
FIG.5
FIG.6

FLAT PANEL TOUCH INTERFACE FOR VEHICLE CLIMATE CONTROL SYSTEM

CROSS REFERENCE TO RELATED APPLICATION

The application claims priority to U.S. Provisional Application No. 61/062,254 which was filed on Jan. 24, 2008.

BACKGROUND OF THE INVENTION

This invention generally relates to control panels for vehicle systems. More particularly, this invention relates to a vehicle control panel that includes a touch sensitive interface integrated into a mechanical button control panel.

A vehicle control panel, such as for a climate control system includes a printed circuit board to which are mounted mechanical switches. A housing supported over the printed circuit board supports button structures that are actuated to engage and actuate each of the mechanical switches. The button structures are typically fabricated from plastic or other material and are tightly toleranced to provide a desired appearance fit and finish. As appreciated, the more stringent the tolerances of the fit and finish the greater the cost. Additionally, the vehicle control panel is a style feature that is continually updated to maintain customer interest in a vehicle, while still meeting performance requirements. Accordingly, it is desirable to design and develop new control panel devices and structures that reduce cost while generating customer interest and meeting customer performance requirements.

SUMMARY OF THE INVENTION

A disclosed example vehicle control panel includes knobs and a touch sensitive interface in place of conventional mechanically activated buttons. The substitution is implemented without modification to the bezel or console assembly and with many components common to consoles utilizing conventional mechanically activated buttons.

The example control panel includes a housing that supports the touch sensitive interface and knobs. The housing defines cavities configured to receive a movable button housing that would engage a mechanical switch mounted on the printed circuit board. The cavities for the movable buttons are utilized to support the touch sensitive interface. The example housing can support both a fully mechanically activated button set of controls, and a combined control panel including both mechanically activated controls, such as the example knobs, along with the touch sensitive interface.

Accordingly, the example control panel assembly includes features that provide for the adaptation and addition of a touch sensitive interface into a previously all mechanical button assembly to provide the freedom to implement innovative features and styles to meet consumer desires.

These and other features of the present invention can be best understood from the following specification and drawings, the following of which is a brief description.

BRIEF DESCRIPTION OF THE DRAWINGS

FIG. 5 is a plan view of an example printed circuit board including an example touch sensitive flex foil.

FIG. 6 is a cross-sectional view of the example control panel.

DETAILED DESCRIPTION OF THE PREFERRED EMBODIMENT

Figure 1:
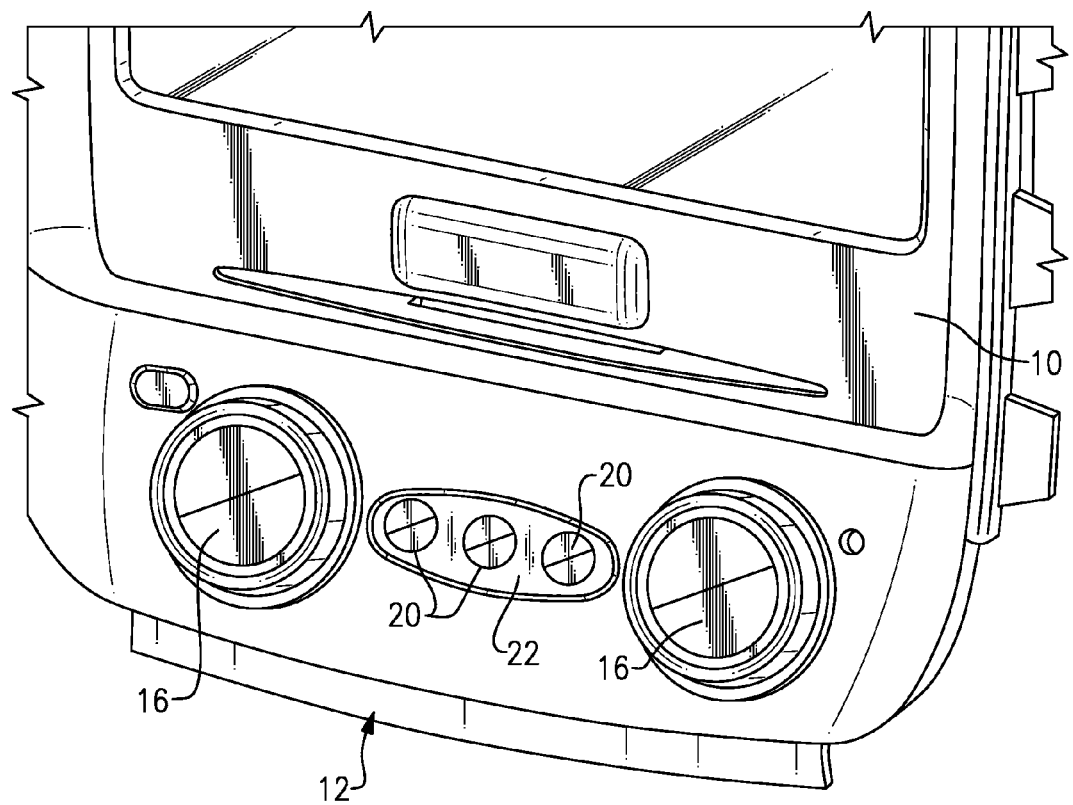
FIG. 1 is a perspective view of an example vehicle control console.

Referring to FIG. 1, an example vehicle console 10 includes an example control panel 12. The example control panel 12 includes knobs 16 and a touch sensitive interface 22. The example touch sensitive interface 22 includes node portions 20 that are engaged to actuate corresponding features. The example control panel 12 is implemented with the touch sensitive interface 22 in the place of conventional mechanically activated buttons. The substitution is implemented without modification to the bezel or console assembly 10 and with many components common to consoles utilizing conventional mechanically activated buttons.

Figure 2:
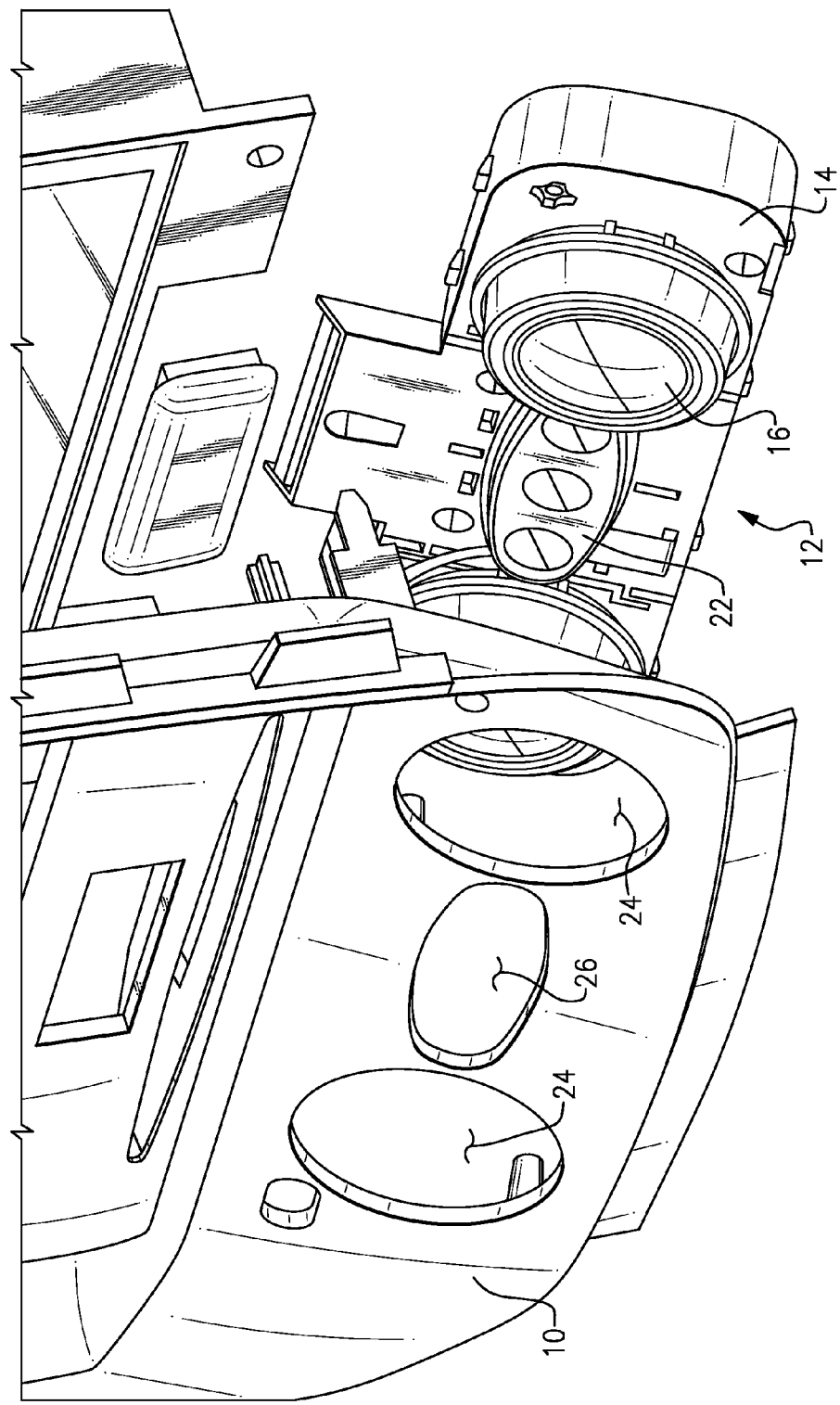
FIG. 2 is an exploded view of the example vehicle control console.

Referring to FIG. 2, the control panel 12 is shown removed from the vehicle console 10. The openings 24 and 26 are the same as those utilized for a control panel including only mechanically actuated controls. The example control panel 12 includes a housing 14 that supports the touch sensitive interface 22 and the knobs 16. Assembly of the control panel 12 to the vehicle console 10 remains the same for the installation of the touch sensitive interface 22.

Figure 3:
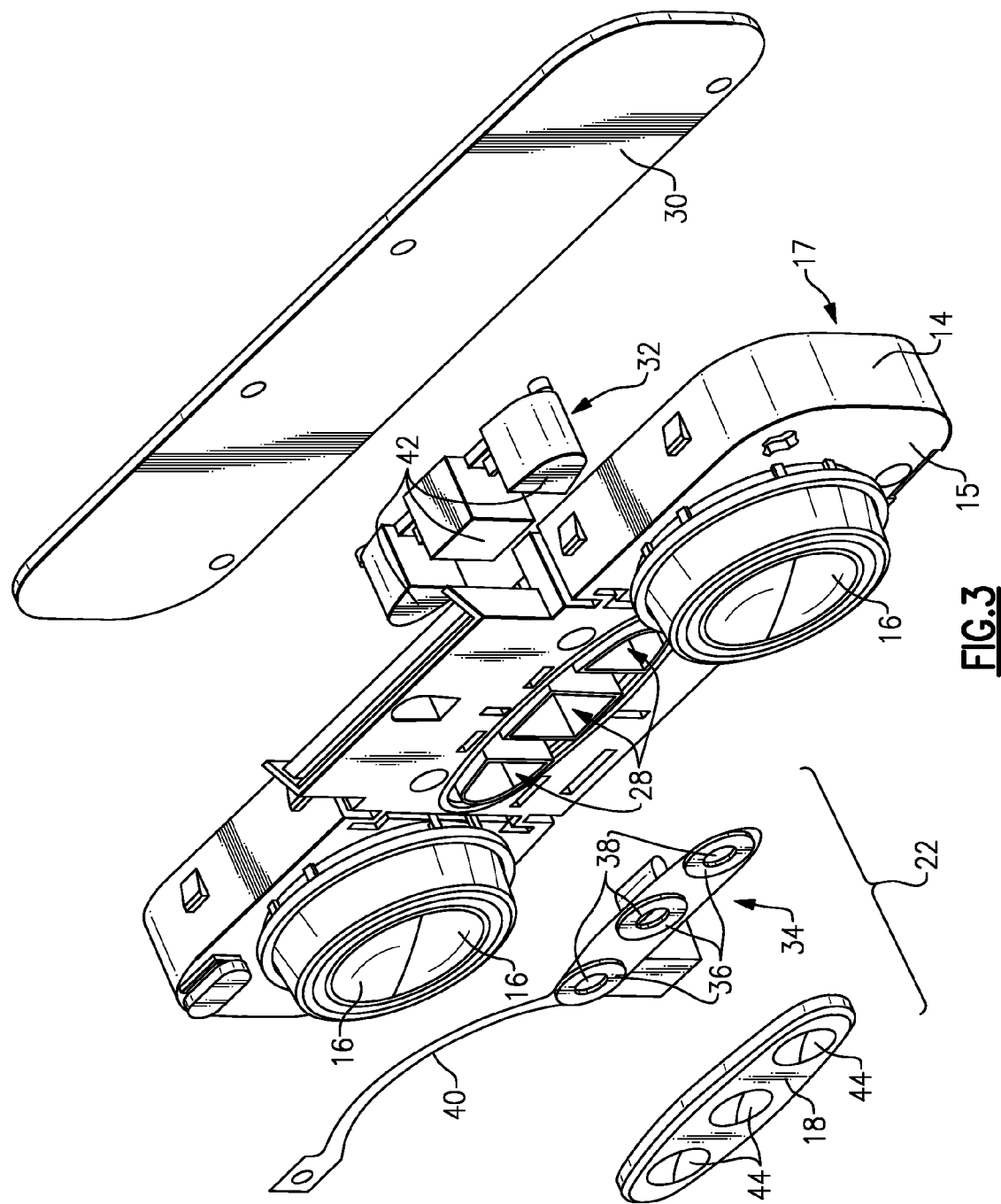
FIG. 3 is an exploded view of an example control panel.
Figure 4:
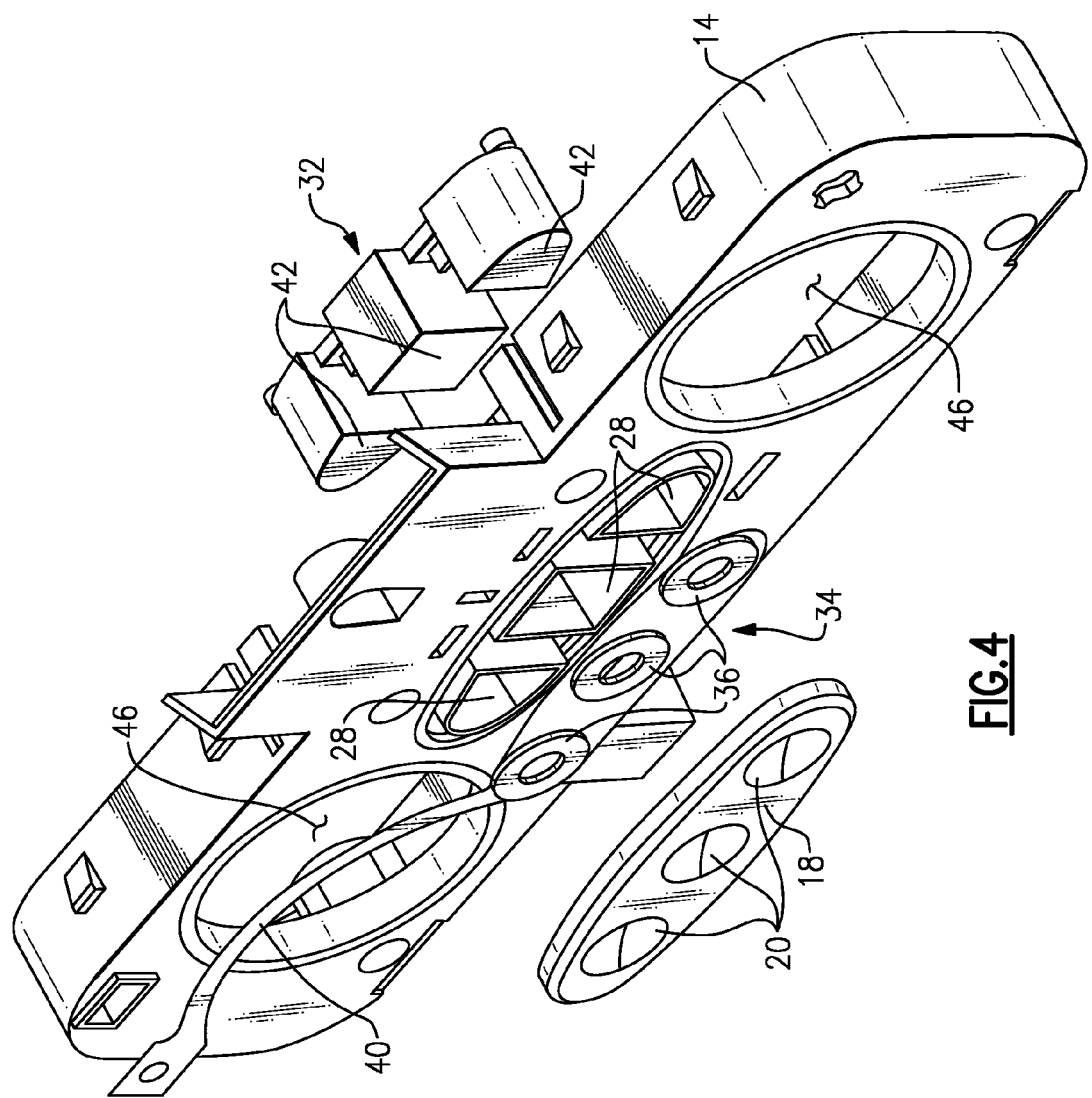
FIG. 4 is another exploded view of a portion of the example control panel.

Referring to FIGS. 3 and 4, the housing 14 includes a front side 15 and a back side 17. Cavities 28 extend through the housing 14 from the front side 15 to the back side 17. The example cavities 28 are originally configured to receive a movable button housing that would engage a mechanical switch mounted on the printed circuit board 30. However, in this example the same cavities 28 are utilized to support the touch sensitive interface 22. As appreciated, the example housing 14 can support both a fully mechanically activated button set of controls, and a combined control panel including both mechanically activated controls, such as the example knobs, along with the touch sensitive interface 22.

The example interface 22 includes a touch sensitive foil 34 with nodes 38 that define the space that when touched activates a desired feature. The example touch sensitive foil 34 utilizes capacitive sensing techniques to send electrical signals to circuits mounted on the circuit board 30. An electrical connector 40 is integrated into the foil 34 and is fed around or through the housing 14 to electrically connect to the circuit board 30.

The nodes 36 of the foil 34 also include transparent portions 38 through which light emitted through the housing 14 from the circuit board is visibly communicated. This visual light provides the desired feedback and indication of the location required to provide the desired actuation.

The cover 18 includes the node portions 44 and fits over foil 34 to protect the foil 34 from damage, and to provide a desired appearance. Further, the cover 18 can include graphical symbols that are illuminatable to communicate the features actuated by contacting each of the nodes 44.

As the foil 34 is flexible, a backing 32 is provided that extends through the cavities 28 such that a front surface 42 is flush or disposed at a desired spacing relative to the front face 15 of the housing 14. The flex foil 34 is supported on the front surface 42 and remains in place.

The example flex foil 34 includes a shape that corresponds with features of the housing 14 and with this example, a shape that corresponds to the span across the openings of the cavities 28. The flexibility and ease of modification to the shape of the flex foil 34 provides for the adaptation of the example touch sensitive interface 22 into any application previously utilizing mechanically actuated buttons.

The backing 32 not only provides the desired support for the flex foil 34, but also can provide for the transmission of light from light sources on the circuit board. As appreciated, with the use of a mechanical button, the movable housing for that button can extend through the corresponding cavity 28 and around a light source on the circuit board. However, when the example flex foil is utilized instead, the backing provides the function of isolating and directing light to the points behind each of the nodes 36.

The openings 46 for the knobs 16 as shown in FIG. 4 illustrate that the example housing 14 can be adapted to use of touch sensitive interface 22 without changing the key features that support the mechanical actuation devices. In this instance, the backing 32 provides support for the flex foil 34 in the area of the cavities 28 to provide for the use of the touch sensitive interface 22.

Referring to FIGS. 5 and 6, the example control panel assembly 12 includes the printed circuit board 30 with the circuit 50 for the flex foil 34. The circuit 50 for the flex foil 34 is substituted into circuit boards for the touch sensitive interface 22. Lights 48 remain in the same location as required for use with a mechanical button assembly. The example circuit board 30 can also be of a common configuration by removing or depopulating the circuit board of the mechanical switches that interface with the movable button housings.

Accordingly, the example control panel assembly includes features that provide for the adaptation and a touch sensitive interface into a previously all mechanical button assembly. The integration of mechanical and touch sensitive actuation devices provide the freedom to implement innovative features and styles to meet consumer and customer desires.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A control panel assembly for a motor vehicle comprising:
    a housing defining a cavity for a movable button housing;
    a mechanically actuated switch supported within the housing;
    a touch sensitive sensor supported within the at least one cavity;
    a backing extending through the at least one cavity for a movable button housing for supporting the touch sensitive sensor, the backing filling the cavity instead of a movable button housing and including a front surface that is disposed substantially even with the front side of the housing; and
    a printed circuit board attached to the housing, the printed circuit board including a mechanical interface with the mechanically actuated switch and an electrical interface with the touch sensitive sensor.

2. The assembly as recited in claim 1, wherein the touch sensitive sensor comprises a capacitive sensor foil.

3. The assembly as recited in claim 1, wherein the mechanically actuated switch supported within the housing comprises a rotatable knob.

4. The assembly as recited in claim 1, including a cover disposed over the touch sensitive sensor and over the cavity for the movable button housing.

5. The assembly as recited in claim 1, wherein the housing comprises a plurality of cavities for a corresponding plurality of movable button housings, and the touch sensitive sensor includes at least one node supported over a corresponding one of the plurality of cavities.

6. The assembly as recited in claim 5, wherein the backing comprises a member that extends from a back side of the housing through each of the plurality of cavities such that the touch sensitive sensor is supported on a front surface of the housing.

7. The assembly as recited in claim 5, wherein the printed circuit board includes a corresponding plurality of light sources for each of the plurality of cavities, and the touch sensitive sensor includes translucent portions for transmitting light through the touch sensitive sensor.

8. The assembly as recited in claim 7, wherein each of the at least one nodes are illuminated by a light source disposed on the printed circuit board.

9. The assembly as recited in claim 7, wherein the cover fits over all of the plurality of cavities.

10. A vehicle control panel assembly comprising:
    a housing including a front side, a back side and a plurality of cavities that extend completely through the housing from the front side to the back side;
    at least one rotatable switch device supported within a housing;
    a backing member extending through each of the plurality of cavities, the backing member including a front surface that is disposed substantially even with the front side of the housing;
    a touch sensitive foil extending over the plurality of cavities and supported by the backing member;
    a cover disposed over the touch sensitive foil and the plurality of cavities and attached to the housing; and
    a printed circuit board attached to the back side of the housing, the printed circuit board in electrical communication with the touch sensitive foil.

11. The assembly as recited in claim 10, including a plurality of light sources mounted to the printed circuit board for directing light through separate ones of the plurality of cavities.

12. The assembly as recited in claim 11, wherein the touch sensitive foil includes a translucent portion through which light from the plurality of light sources is visible.

13. The assembly as recited in claim 12, wherein the touch sensitive foil includes at least one node that corresponds with one of the cavities through the housing.

14. The assembly as recited in claim 10, wherein the touch sensitive foil comprises a capacitive sensing device.

15. The assembly as recited in claim 10, wherein the touch sensitive foil includes an electrical ground connection.

* * * * *